(12) United States Patent
Kim et al.

(10) Patent No.: US 11,756,915 B2
(45) Date of Patent: Sep. 12, 2023

(54) METHOD AND STRUCTURE TO CONTROL THE SOLDER THICKNESS FOR DOUBLE SIDED COOLING POWER MODULE

(71) Applicants: Hyundai Motor Company, Seoul (KR); Kia Motors Corporation, Seoul (KR)

(72) Inventors: Tae Hwa Kim, Hwaseong-Si (KR); Myung Ill You, Gwangju (KR)

(73) Assignees: Huyndai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 17/035,430

(22) Filed: Sep. 28, 2020

(65) Prior Publication Data

US 2021/0327842 A1 Oct. 21, 2021

(30) Foreign Application Priority Data

Apr. 20, 2020 (KR) .................. 10-2020-0047552

(51) Int. Cl.
*H01L 23/00* (2006.01)
*H01L 23/367* (2006.01)

(52) U.S. Cl.
CPC .......... *H01L 24/29* (2013.01); *H01L 23/3675* (2013.01); *H01L 24/11* (2013.01); *H01L 24/13* (2013.01); *H01L 2224/29018* (2013.01)

(58) Field of Classification Search
CPC ............ H01L 23/3675; H01L 23/3735; H01L 23/367; H01L 23/488; H01L 24/11; H01L 24/13; H01L 24/29; H01L 2224/29018; H01L 24/32; H01L 24/75; H01L 24/83; H01L 21/4882; H01L 2224/131; H01L 2224/26165; H01L 2224/291; H01L 2224/32238; H01L 2224/32245; H01L 2224/33181; H01L 2224/75756
USPC ......................................................... 257/777
See application file for complete search history.

(56) References Cited

U.S. PATENT DOCUMENTS

| | | | | |
|---|---|---|---|---|
| 7,262,444 B2 * | 8/2007 | Fillion | ................ | H01L 23/4822 361/709 |
| 7,632,718 B2 * | 12/2009 | Hosseini | ................. | H01L 24/37 257/691 |
| 8,063,440 B2 * | 11/2011 | Yankoski | ................ | H01L 25/18 257/334 |
| 8,497,166 B2 * | 7/2013 | Umemura | ............... | H01L 23/24 257/E23.116 |

(Continued)

FOREIGN PATENT DOCUMENTS

| | | | | |
|---|---|---|---|---|
| DE | 112017002961 T5 * | 2/2019 | ............. | H01L 23/40 |
| KR | 20170069363 A | 6/2017 | | |

(Continued)

*Primary Examiner* — Khiem D Nguyen
(74) *Attorney, Agent, or Firm* — MORGAN, LEWIS & BOCKIUS LLP (57) ABSTRACT

In a soldering structure, a power module having the same, and a method for manufacturing the power module configured for constantly determining a height of a power module when the power module is manufactured, the soldering structure may include a soldering target portion; a metal layer including a bonding surface having a bonding region in which the soldering target portion is bonded by solder; and at least one wire located in the solder within the bonding region.

6 Claims, 5 Drawing Sheets

(56) References Cited

U.S. PATENT DOCUMENTS

| | | | | |
|---|---|---|---|---|
| 8,520,389 | B2* | 8/2013 | Rozman | H01L 23/34 |
| | | | | 361/709 |
| 8,654,541 | B2* | 2/2014 | Robert | H01L 23/3735 |
| | | | | 361/767 |
| 9,041,183 | B2* | 5/2015 | Liang | H01L 23/473 |
| | | | | 257/691 |
| 9,136,193 | B2* | 9/2015 | Minamio | H01L 23/053 |
| 9,731,370 | B2* | 8/2017 | Uhlemann | B23K 9/042 |
| 9,922,911 | B1* | 3/2018 | Park | H01L 23/49562 |
| 10,727,173 | B2* | 7/2020 | Park | H01L 23/492 |
| 2007/0018338 | A1* | 1/2007 | Hosseini | H01L 24/78 |
| | | | | 257/784 |
| 2018/0047697 | A1* | 2/2018 | Lüdeke | H01L 24/85 |
| 2018/0082920 | A1* | 3/2018 | Hiyoshi | B23K 26/323 |
| 2018/0082925 | A1* | 3/2018 | Grassmann | H01L 23/49531 |
| 2019/0304866 | A1* | 10/2019 | Kitabayashi | H01L 24/92 |
| 2019/0363029 | A1* | 11/2019 | Guillon | H01L 23/16 |

FOREIGN PATENT DOCUMENTS

| | | |
|---|---|---|
| KR | 20170092750 A | 8/2017 |
| KR | 20180052143 A | 5/2018 |

\* cited by examiner

METHOD AND STRUCTURE TO CONTROL THE SOLDER THICKNESS FOR DOUBLE SIDED COOLING POWER MODULE

CROSS REFERENCE TO RELATED APPLICATION

The present application claims priority to Korean Patent Application No. 10-2020-0047552 filed on Apr. 20, 2020, the entire contents of which is incorporated herein for all purposes by this reference.

BACKGROUND OF THE DISCLOSURE

Field of the Disclosure

The present invention relates to the method and structure to control the solder thickness for the double sided cooling power module which may constantly determine the height of a power module when the power module is manufactured.

Description of Related Art

Generally, a power module used for converting power to drive an electric motor for (x)EV vehicle has a structure of forming an electrical connection by bonding a power semiconductor chip, substrates disposed on the upper and lower portions of the power semiconductor chip, and other different various parts to one another. Since a power semiconductor device has a high-speed switching which converts high power, a lot of heat is generated and to prevent performance degradation by easily discharging the heat, a double-sided cooling power module which may attach cooling channels to the upper and lower portions of the power module was developed. The double-sided cooling power module has a structure in which substrates are provided on the upper and lower portions of the power module, respectively so that the substrates may be in contact with upper and lower cooling channels.

In the case of such a double-sided cooling power module, it is important to make the height of the power module constant. This is because the cooling channel to be in contact with the upper and lower substrates of the power module with a thermal interface material (TIM) interposed therebetween needs to be in uniform contact with the power module, there is a concern of damage to the substrate or the other electrical connections when a constant amount of molding materials is injected in a molding process in manufacturing the power module, and the molding material may penetrate into a low height, degrading cooling performance of the power module.

Conventionally, a height control of the power module is performed by a soldering process which physically and electrically connects parts in the power module. The conventional height control of the power module utilizes a method for providing a large amount of solder provided upon soldering between the parts placed between the upper and lower substrates of the power module and the substrate or soldering between the parts to make the height high by the solder provided a lot if the height of the power module is low and to make the solder spread around if the height of the power module is high, lowering the height.

The conventional power module height control method is applied with a plurality of soldering processes which manufactures each part of the power module through a primary soldering and then secondarily solders each part manufactured again. In the case of forming a solder layer (a solder compensation layer) for height adjustment upon the primary process, the solder compensation layer needs to be manufactured at a predetermined height or higher, but there is a problem in that the solder flows out horizontally due to the load of the parts to be soldered upon the primary soldering process, not securing the height of the solder compensation layer as necessary.

Furthermore, this causes a problem in that it is impossible to manufacture the power module to a desired height in a subsequent secondary soldering process.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a soldering structure, the power module having the same, and a method for manufacturing the power module, which may secure the height of the portion to which a solder compensation layer is applied in a primary soldering process of a power module at a certain level or more and then manufacture the power module having a desired height in a secondary soldering process.

As a means for achieving the object, various aspects of the present invention provide a soldering structure including: a soldering target portion; a metal layer including a bonding surface having a bonding region in which the soldering target portion is bonded by solder; and at least one wire located in the solder within the bonding region.

In various exemplary embodiments of the present invention, the wire may have at least a convex portion which is formed toward the soldering target portion.

In the exemplary embodiment of the present invention, both end portions of the wire may be fixed to the bonding surface and a portion between both the end portions of the wire may be spaced from the bonding surface toward the soldering target portion to form the convex portion.

In the exemplary embodiment of the present invention, both the end portions of the wire and at least the portion between both the end portions may form a plurality of fixing portions fixed to the bonding surface, and a portion of the wire corresponding between the plurality of fixing portions may be spaced from the bonding surface toward the soldering target portion to form the convex portion.

In the exemplary embodiment of the present invention, the at least one wire may include a plurality of wires mounted along the circumference of the bonding region.

In the exemplary embodiment of the present invention, the convex portion of the wire may be located between the soldering target portion and the metal layer.

As another means for achieving the object, various aspects of the present invention provide a power module including: a spacer; a first substrate having a first metal layer including an upper surface having a bonding region in which the spacer is bonded by solder; and at least one wire located in the solder within the bonding region.

In various exemplary embodiments of the present invention, the wire may have at least a convex portion which is formed toward the spacer.

In the exemplary embodiment of the present invention, both end portions of the wire may be fixed to the upper surface of the first metal layer and a region between both the end portions of the wire may be spaced from the upper surface of the first metal layer toward the spacer to form the convex portion.

In the exemplary embodiment of the present invention, the both end portions of the wire and at least a portion between both the end portions may form a plurality of fixing portions fixed to the upper surface of the first metal layer, and a region of the wire corresponding between the plurality of fixing portions may be spaced from the upper surface of the first metal layer toward the spacer to form the convex portion.

In the exemplary embodiment of the present invention, the at least one wire may be mounted along the circumference of the bonding region.

In the exemplary embodiment of the present invention, the convex portion may be mounted between the spacer and the first metal layer.

In the exemplary embodiment of the present invention, the power module may further include: a power semiconductor chip having one surface which is bonded to the spacer in an opposite direction of the first substrate; and a second substrate having a second metal layer bonded to the other surface of the power semiconductor chip.

As yet another means for achieving the object, various aspects of the present invention provide a method for manufacturing a power module including:

bonding at least one wire having a convex portion which is convex upward to a bonding region of an upper surface of a first metal layer of a first substrate having the first metal layer; manufacturing a first portion by disposing a spacer on the bonding region to be in contact with the convex portion and soldering the spacer and the first metal layer and a second portion by soldering one surface of a power semiconductor chip on a lower surface of a second metal layer of a second substrate having the second metal layer; and disposing the first portion and the second portion between upper and lower jigs so that an upper surface of the spacer and a lower surface of the power semiconductor chip surface each other while soldering the upper surface of the spacer and the lower surface of the power semiconductor chip and adjusting a distance between the upper and lower jigs to correspond to a predetermined height of a power module.

According to the soldering structure, the power module having the same, and the method for manufacturing the power module, it is possible to secure a proper interval between the parts at the location where the solder, which corresponds to the solder compensation layer in which the amount of solders is adjusted for height adjustment of the power module, is formed regardless of the amount of solder or the height of solder, securing the sufficient height margin for the height adjustment in the subsequent final soldering process.

Accordingly, according to the soldering structure, the power module having the same, and the method for manufacturing the power module, it is possible to uniformly manufacture the height of the power module to which the upper and lower substrates are applied for double-sided cooling, improving the quality of the power module, and to also take the uniform contact state between the power module and the cooling channel, greatly helping to improve the cooling performance of the power module.

The effects obtainable in various exemplary embodiments of the present invention are not limited to the aforementioned effects, and other effects not mentioned may be clearly understood by those skilled in the art to which various exemplary embodiments of the present invention pertains from the following description.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION OF THE PRESENT INVENTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, a soldering structure, a power module having the same, and a method for manufacturing the power module according to various exemplary embodiments of the present invention will be described in detail with reference to the accompanying drawings.

Figure 1:
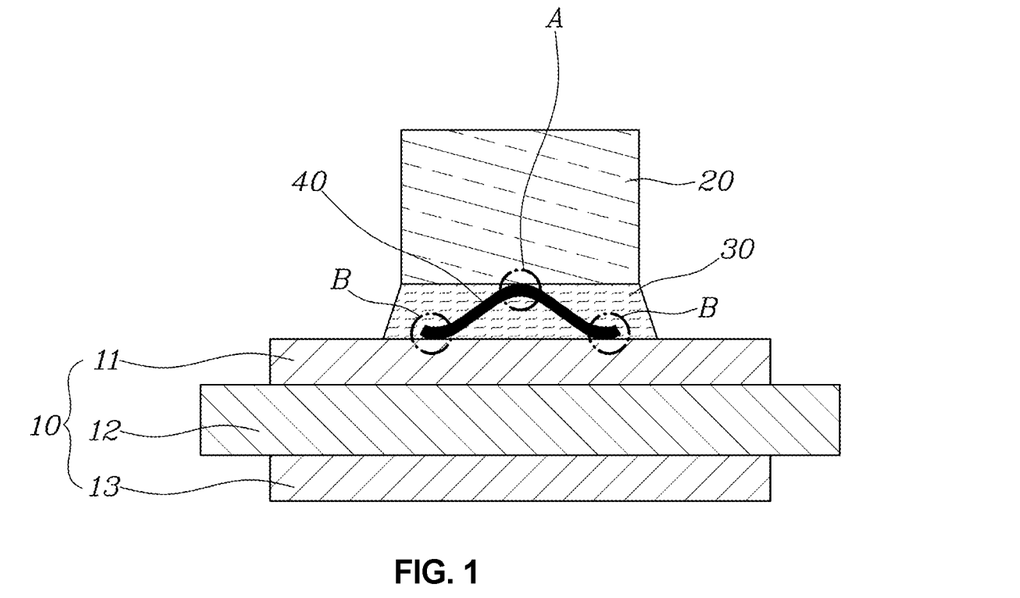
FIG. 1 is a cross-sectional diagram illustrating a soldering structure according to various exemplary embodiments of the present invention.
Figure 2:
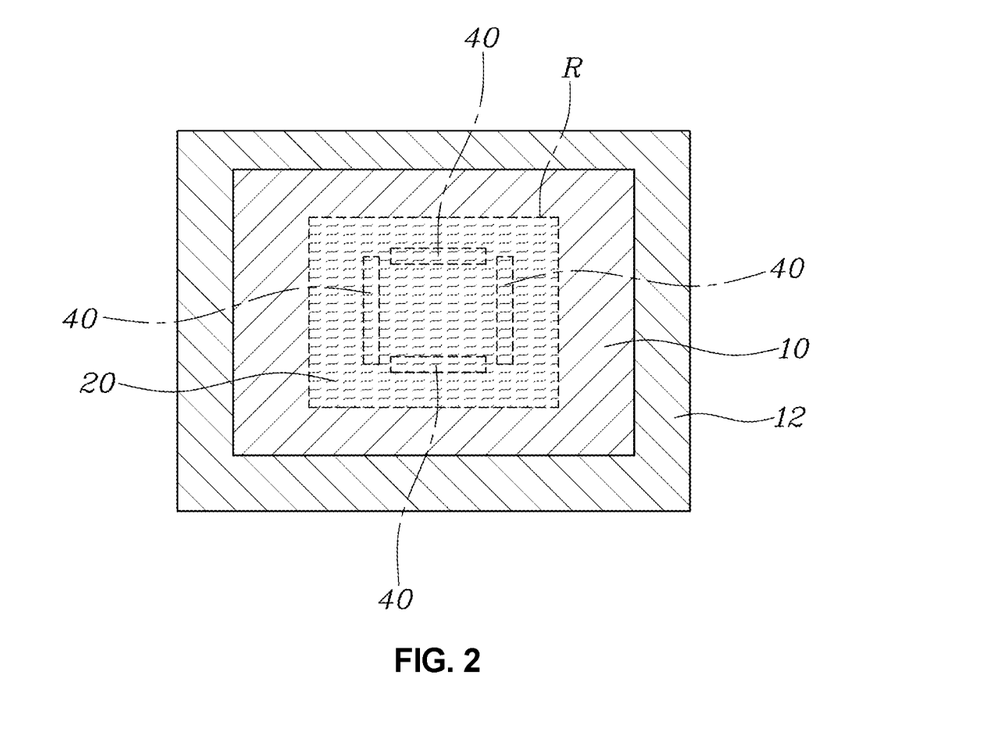
FIG. 2 is a plan diagram of the soldering structure illustrated in FIG. 1.

FIG. 1 is a cross-sectional diagram illustrating a soldering structure according to various exemplary embodiments of the present invention, and FIG. 2 is a plan diagram of the soldering structure illustrated in FIG. 1.

Referring to FIG. 1 and FIG. 2, a soldering structure according to various exemplary embodiments of the present invention may include a soldering target portion 20, a metal layer 11 including a bonding surface having a bonding region R in which the soldering target portion 20 is bonded by a solder 30, and at least one wire 40 disposed in the bonding region R to have a convex portion formed toward the soldering target portion 20.

In such a structure, the convex portion of the wire 40 may support the soldering target portion 20 to separate the soldering target portion 20 from the bonding surface of the metal layer 11 at a predetermined height. In a portion manufactured in a primary soldering process of a power module, that is, a portion corresponding to the structure in which a spacer 20 to be soldered is soldered on a first metal layer 11 of a first substrate 10, when the solder between the first metal layer 11 and the spacer 20 is to be used as a solder compensation layer, a soldering structure according to various exemplary embodiments of the present invention may be employed to properly secure a distance between the spacer 20 and the first metal layer 11.

To determine the height of the power module in a secondary soldering process of the power module at a desired height, first, the distance between the spacer 20 where the solder compensation layer is located and the first metal layer 11 of the first substrate 10 needs to be sufficiently secured. This is because the power module may be completed at the desired height while properly reducing the height between the upper and lower jigs upon soldering only when the height higher than the desired height of the power module is secured before the soldering is performed in the secondary soldering process of vertically bonding the parts manufactured by the primary soldering through the upper and lower jigs.

For the wire 30 to properly support the soldering target portion 20, both end portions B of the wire 30 need to be fixed to the bonding surface and the intermediate portion of the wire 30 is convexly curved toward the soldering target portion 20 to form a convex portion A.

Furthermore, a plurality of wires 30 are preferably mounted along the circumference of the bonding region R to stably support the soldering target portion 20 on the upper portion of the metal layer 11 almost in parallel to each other.

Of course, since the convex portion A of the wire 30 needs to support the soldering target portion 20 at the bottom portion, the wire 30 is preferably disposed to be located between the soldering target portion 20 and the metal layer 11.

FIG. 1 illustrates an example in which the soldering structure is formed on a portion of the power module, and the soldering target portion 20 may be a spacer, and the metal layer 11 may be a metal layer configuring the substrate 10. The substrate 10 may include the first metal layer 11 and a second metal layer 13 and a dielectric layer 12 mounted between the first metal layer 11 and the second metal layer 13 to be in surface-contact with the first metal layer 11 and the second metal layer 13.

Figure 3:
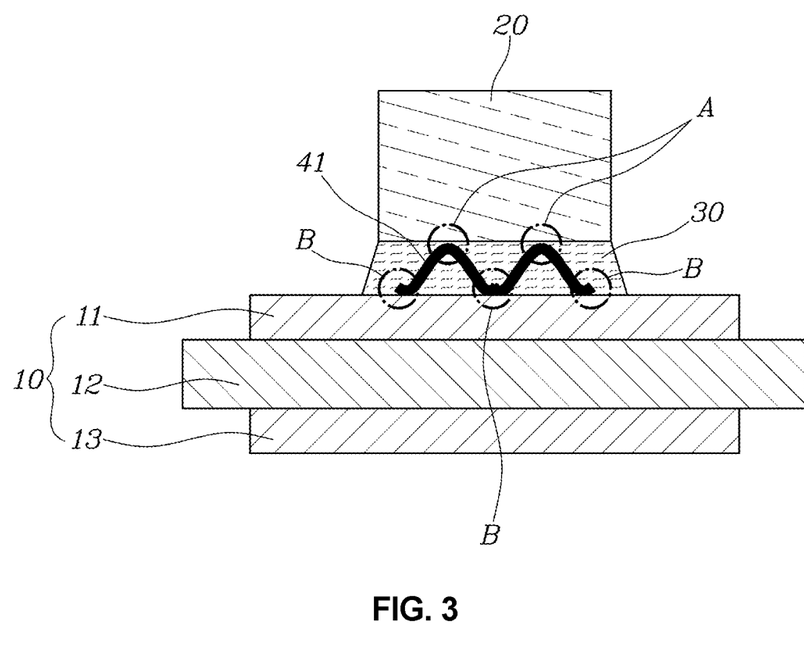
FIG. 3 is a cross-sectional diagram illustrating a soldering structure according to various exemplary embodiments of the present invention.

FIG. 3 is a cross-sectional diagram illustrating a soldering structure according to various exemplary embodiments of the present invention.

As illustrated in the exemplary embodiment illustrated in FIG. 3, the wire 41 has both end portions fixed to the bonding surface of the metal layer 11 and a portion between both end portions of the wire 41 may also be fixed to the bonding surface to form a plurality of fixing portions B. A plurality of convex portions A which are convex toward the soldering target portion 20 may be formed by the fixing portion B structure.

As described above, if the plurality of convex portions A are formed by one wire 41, there is an advantage in that the convex portions A may secure a greater supporting force supporting the spacer 20.

Figure 4:
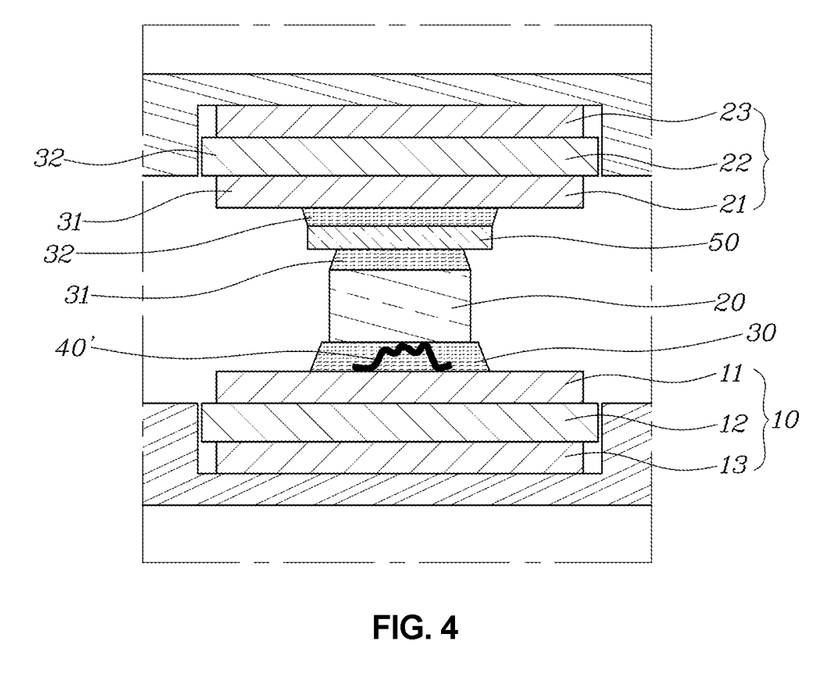
FIG. 4 is a cross-sectional diagram illustrating a power module according to the exemplary embodiment of the present invention.

FIG. 4 is a cross-sectional diagram illustrating a power module according to the exemplary embodiment of the present invention.

As illustrated in FIG. 4, the power module according to the exemplary embodiment of the present invention may include, as the power module in which the aforementioned soldering structure is employed, the spacer 20, the first substrate having the first metal layer including the upper surface having the bonding region in which the spacer 20 is bonded by the solder, and at least one wire 40' mounted in the bonding region to have a convex portion formed toward the spacer.

The first substrate 10 may have a structure in which the first metal layer 11, the dielectric layer 12, and the second metal layer 13 are sequentially laminated with each other. The first metal layer 11 may have the bonding surface bonded to the spacer 20 by the soldering.

The spacer 20 is an element for making an electrical connection while providing a constant height to the power module. One end portion of the spacer 20 may be bonded to the first metal layer 11 by the solder and the other end portion thereof may be bonded to other portions by the solder. In the exemplary embodiment illustrated in FIG. 4, the other end portion of the spacer 20 may be soldered to a power semiconductor chip 50.

The power module according to the exemplary embodiment of the present invention may include the power semiconductor chip 50 physically and electrically bonded to the surface opposite to the surface bonded to the first metal layer 11 of the spacer 20 and a second substrate 25 having a third metal layer 21 physically and electrically bonded to the surface opposite to the surface bonded to the spacer 20 of the power semiconductor chip 50. For convenience of description, a location of each portion in the power module will be described in the vertical relationship represented as the state illustrated in FIG. 4.

The bonding between the spacer 20 and the power semiconductor chip 50 and the bonding between the power semiconductor chip 50 and the third metal layer 21 may be made as solders 31, 32. If an excessive amount of the solders 31, 32 forming the physical and electrical connection between the power semiconductor chip 50 and other portions are applied, there may occur a problem in that the upper and lower surfaces of the power semiconductor chip 50 are short-circuited over the side surface of the power semiconductor chip 50, so that the solders are not appropriate to be applied as the solder compensation layer for adjusting the height of the power module. Accordingly, it is appropriate to use the solder layer 30 formed between the spacer 20 and the metal layer 11 as the solder compensation layer to adjust the height of the power module when the power module is manufactured.

As the first substrate 10 and the second substrate 25, an insulating substrate commonly known as double bonded copper (DBC) may be employed. The two substrates 10, 25 have a structure in which a dielectric layer is located between two metal layers to be laminated. In the description of the present invention, the two metal layers provided on the first substrate 10 may be each referred to as the first metal layer 11 and the second metal layer 13, and the two metal layers provided on the second substrate 25 may be referred to as a third metal layer 21 and a fourth metal layer 23. The dielectric layer 12 is located between the first metal layer 11 and the second metal layer 13 and a dielectric layer 22 is located between the third metal layer 21 and the fourth metal layer 23. However, in the claims, the expression of the ordinal number may also be different from the description of the present invention according to the order in which each metal layer is described.

In the example illustrated in FIG. 4, the wire 40' may also be deformed by pressure acting between the spacer 20 and the metal layer 11 if a vertical jig interval is narrowed to adjust the height of the power module upon manufacturing. After deformation, the wire 40' may have a shape in which the convex portion is distorted as illustrated in FIG. 4 or in some cases, may also have a shape attached to the upper surface of the first metal layer 11 in a deformed state.

In the power module according to the exemplary embodiment of the present invention, a soldering structure described with reference to FIG. 1, FIG. 2, and FIG. 3 may be formed between the spacer 20 and the first metal layer 11 of the first substrate 10. That is, the soldering target portions illustrated in FIG. 1, FIG. 2, and FIG. 3 correspond to spacers, and the metal layer illustrated in FIG. 1, FIG. 2, and FIG. 3 may be the first metal layer of the first substrate.

FIG. 5, FIG. 6, FIG. 7, FIG. 8, and FIG. 9 are cross-sectional diagrams illustrating a method for manufacturing the power module according to the exemplary embodiment of the present invention in a process order.

Figure 5:
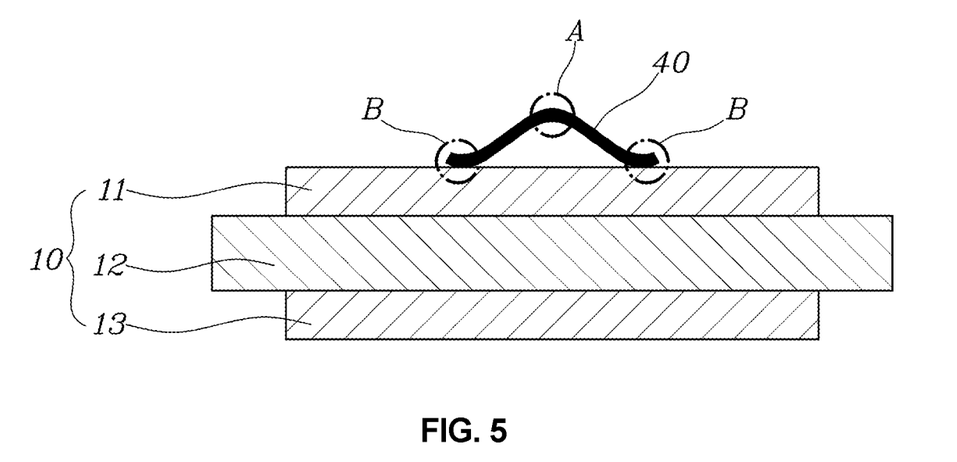
FIG. 5, FIG. 6, FIG. 7, FIG. 8, and FIG. 9 are cross-sectional diagrams illustrating a method for manufacturing the power module according to the exemplary embodiment of the present invention in a process order.

A method for manufacturing the power module according to the exemplary embodiment of the present invention first performs bonding at least one wire 40 having the convex portion A which is convex toward the upper portion to the bonding region of the upper surface of the first metal layer 11 of the first substrate 10 having the first metal layer 11 as illustrated in FIG. 5. The wire 40 may be bonded by various methods known in the art.

Figure 6:
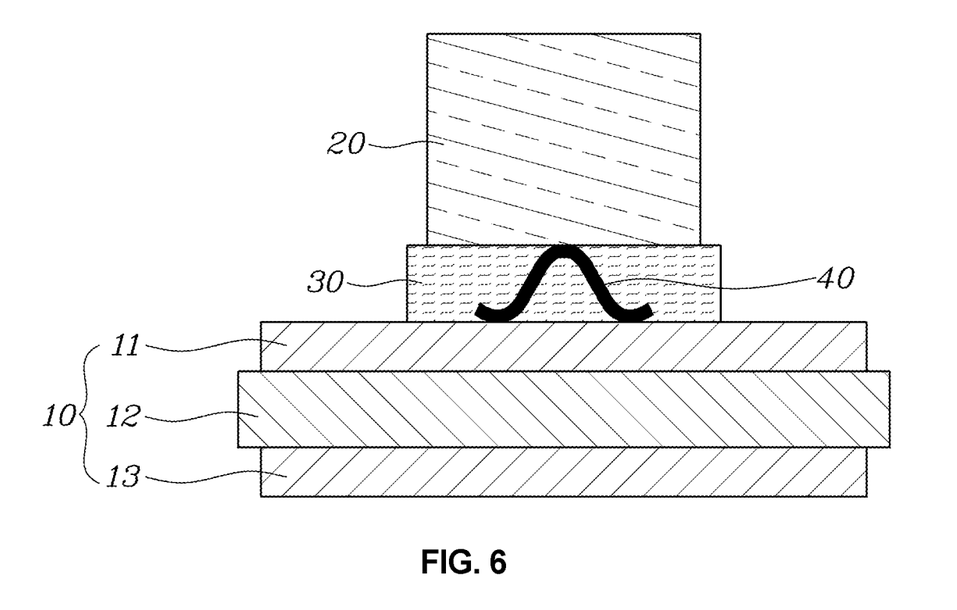

Subsequently, as illustrated in FIG. 6, a first portion illustrated in FIG. 7 may be manufactured through solder melting after applying the solder 30 to the bonding region and disposing the spacer 20 on the solder 30. FIG. 6 illustrates a state before the solder is melted, and the solder illustrated in FIG. 6 may be a creamy solder which may be applied, and at the present time, a relatively large amount of the solders may be applied to form a solder compensation layer. Furthermore, the solder may be applied to cover all of the wires 40.

Figure 7:
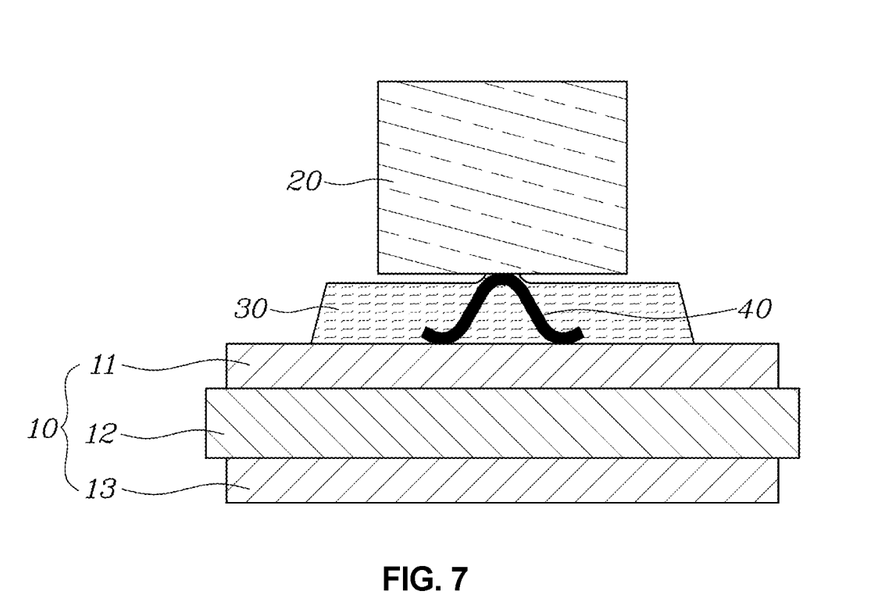
Figure 8:
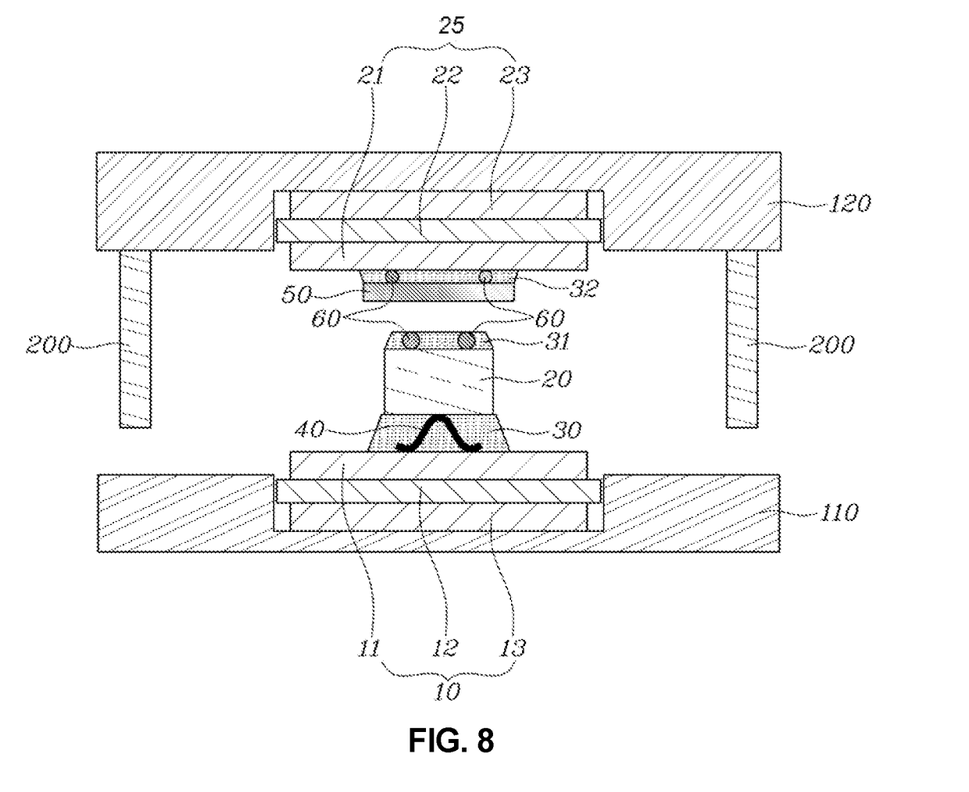
Figure 9:
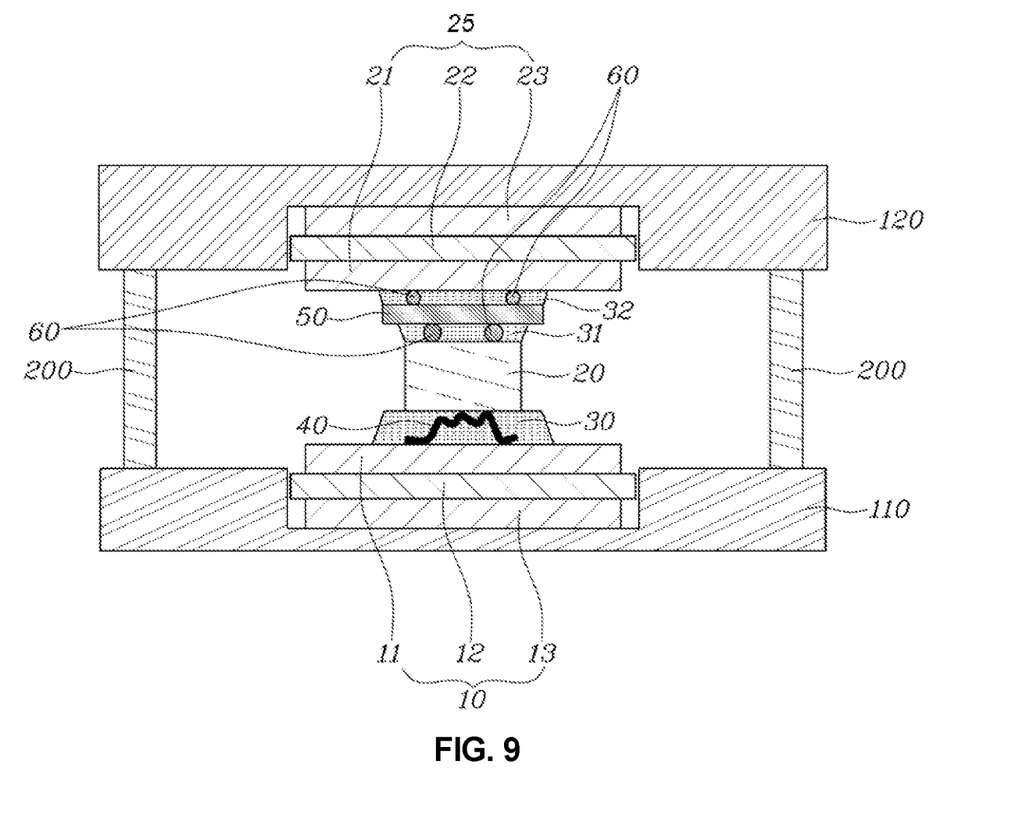

When the solder is melted in the arrangement state illustrated in FIG. 6, the applied solder may spread laterally by gravity while being melted and the height of the melted solder may also be lower than the convex portion formed by the wire 40 as illustrated in FIG. 7. In the exemplary embodiment of the present invention, since the wire 40 may support the spacer 20, it is possible to secure a constant height even when the height of the solder is lowered by the melting in the primary soldering process of manufacturing the first portion.

Meanwhile, a second portion which is bonded to the first portion in a subsequent secondary soldering process may also be manufactured. The second portion may be manufactured by bonding the power semiconductor chip 50 to the lower surface of the third metal layer 21 configuring the second substrate 25 through the soldering as illustrated in FIG. 7. In the soldering between the third metal layer 21 and the power semiconductor chip 50, a metal ball 60 may be used to secure the height of the solder 32 to a minimum.

Since the process of manufacturing the second portion has no special features, a separate drawing describing the process of manufacturing the second portion will be omitted.

Subsequently, the secondary soldering process of soldering the upper surface of the spacer 20 and the lower surface of the power semiconductor chip may be performed. As illustrated in FIG. 7, the secondary soldering process may be a process which attaches the first portion to a lower jig 110, disposes the second portion on an upper jig 120 so that the power semiconductor chip 50 faces downward, then disposes the metal ball 60 on the upper surface of the spacer 20, and then applies the solder 31, and accordingly, performs the soldering while adjusting an interval between the upper and lower jigs 110, 120 to a desired predetermined interval by a height adjustment pillar 200.

Here, the predetermined interval between the upper and lower jigs 110, 120 may be an interval corresponding to a preset height of the power module.

The soldering structure according to the exemplary embodiment of the present invention may allow secondary soldering to be performed in a state where a sufficient height is secured in advance using the wire 40 between the first metal layer 11 and the spacer 20. That is, the height of the power module in the state where the first portion and the second portion are only in vertical contact with each other before the secondary soldering is performed (the state before the solder is melted) may be greater than the height of the power module to be achieved in a final finished product.

Accordingly, if only the interval between the upper and lower jigs 110, 120 is appropriately adjusted to correspond to the desired height of the power module upon the secondary soldering, the height of the solder 30 between the spacer 20 and the first metal layer 11 may be appropriately formed while the wire 40 is deformed by the pressure provided by each of the upper and lower jigs 110, 120, manufacturing the power module having the desired height.

As described above, according to the soldering structure, the power module having the same, and the method for manufacturing the power module according to various exemplary embodiments of the present invention, it is possible to secure a proper interval between the portions at the location where the solder, which corresponds to the solder compensation layer in which the amount of solders is adjusted for height adjustment of the power module, is formed regardless of the amount of solder or the height of solder, securing the sufficient height margin for the height adjustment in the subsequent final soldering process. Accordingly, the soldering structure, the power module having the same, and the method for manufacturing the power module according to various exemplary embodiments of the present invention may uniformly manufacture the height of the power module to which the upper and lower substrates are applied for double-sided cooling, improving the quality of the power module.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A power module including:
   a spacer;
   a first substrate having a first metal layer including an upper surface having a bonding region in which the spacer is bonded by a first solder; and
   at least one wire located in the first solder within the bonding region;
   a power semiconductor chip having a first surface which is bonded to the spacer in an opposite direction of the first substrate;
   a second substrate having a second metal layer bonded to a second surface of the power semiconductor chip; and
   a metal ball disposed in a second solder between a third metal layer included in the second substrate and the power semiconductor chip to secure a minimum height of the second solder by a height of the metal ball.

2. The power module according to claim 1, wherein the at least one wire has at least a convex portion which is formed toward the spacer.

3. The power module according to claim 2, wherein a first end portion and a second end portion of the at least a wire are fixed to the upper surface of the first metal layer and a region between the first end portion and the second end portion of the at least a wire is spaced from the upper surface of the first metal layer toward the spacer to form the at least a convex portion.

4. The power module according to claim 2, wherein a first end portion and a second end portion of the at least a wire and at least a portion between the first end portion and the second end portion of the at least a wire form a plurality of fixing portions fixed to the upper surface of the first metal layer, and a region of the at least a wire corresponding between the plurality of fixing portions are spaced from the upper surface of the first metal layer toward the spacer to form the at least a convex portion.

5. The power module according to claim 1, wherein the at least one wire includes: a plurality of wires mounted along a circumference of the bonding region.

6. The power module according to claim 2, wherein the at least a convex portion is disposed between the spacer and the first metal layer.

* * * * *